(12) United States Patent
Panitz

(10) Patent No.: US 10,497,589 B2
(45) Date of Patent: Dec. 3, 2019

(54) METHOD AND DEVICE FOR SEVERING A MICROCHIP FROM A WAFER AND ARRANGING THE MICROCHIP ON A SUBSTRATE

(71) Applicant: JENOPTIK Optical Systems GmbH, Jena (DE)

(72) Inventor: Meik Panitz, Weimar (DE)

(73) Assignee: JENOPTIK Optical Systems GmbH, Jena (DE)

( * ) Notice: Subject to any disclaimer, the term of this patent is extended or adjusted under 35 U.S.C. 154(b) by 0 days.

(21) Appl. No.: 15/558,859

(22) PCT Filed: Jan. 23, 2017

(86) PCT No.: PCT/DE2017/100035
§ 371 (c)(1),
(2) Date: Sep. 15, 2017

(87) PCT Pub. No.: WO2017/129171
PCT Pub. Date: Aug. 3, 2017

(65) Prior Publication Data
US 2019/0122908 A1 Apr. 25, 2019

(30) Foreign Application Priority Data
Jan. 29, 2016 (DE) .................... 10 2016 001 322

(51) Int. Cl.
*B23K 31/02* (2006.01)
*H01L 21/67* (2006.01)
(Continued)

(52) U.S. Cl.
CPC ........ *H01L 21/67144* (2013.01); *B65G 47/92* (2013.01); *H01L 21/67132* (2013.01);
(Continued)

(58) Field of Classification Search
CPC .......... B23K 1/018; B23K 2101/36–42; B23P 6/002–007; B23P 2700/00–50;
(Continued)

(56) References Cited

U.S. PATENT DOCUMENTS 3,707,760 A * 1/1973 Citrin ............... H01L 21/67092
29/413
3,911,568 A * 10/1975 Hartleroad ........ H01L 21/67144
29/834
(Continued)

FOREIGN PATENT DOCUMENTS

EP 1 336 986 B1 5/2008
EP 2 852 271 A1 3/2015
(Continued)

*Primary Examiner* — Kiley S Stoner
(74) *Attorney, Agent, or Firm* — Duane Morris LLP

(57) ABSTRACT

Method and device for severing a microchip from a wafer and arranging the microchip on a substrate, wherein the microchip is contact-bonded to the free end of a tip during severing and accordingly adheres to the tip through adhesive force while the substrate is transported. A coordinate measuring machine can advantageously be used as device.

6 Claims, 3 Drawing Sheets

(51) Int. Cl.
*H01L 23/00* (2006.01)
*H01L 21/683* (2006.01)
*B65G 47/92* (2006.01)

(52) U.S. Cl.
CPC .......... *H01L 21/6831* (2013.01); *H01L 24/97* (2013.01); *H01L 24/98* (2013.01); *H01L 24/799* (2013.01); *H01L 2224/7999* (2013.01); *H01L 2224/98* (2013.01)

(58) Field of Classification Search
CPC ....... F01D 5/005; H05K 3/3415; H01L 24/98; H01L 24/799; H01L 2224/98; H01L 2224/7999; H01L 21/67144; H01L 24/97; H01L 21/67132; H01L 21/6831; B65G 47/92
USPC ..... 228/212–213, 170, 44.7, 44.3, 191, 264, 228/119
See application file for complete search history.

(56) References Cited

U.S. PATENT DOCUMENTS

| | | | | | |
|---|---|---|---|---|---|
| 4,283,839 | A | * | 8/1981 | Gursky | H01L 23/49565 228/170 |
| 4,581,096 | A | * | 4/1986 | Sato | H01L 21/67132 156/261 |
| 4,756,080 | A | * | 7/1988 | Thorp, Jr. | H01L 21/67144 29/827 |
| 5,513,792 | A | * | 5/1996 | Onitsuka | H01L 21/67144 454/57 |
| 6,146,912 | A | * | 11/2000 | Tighe | H01L 21/67144 438/15 |
| 6,201,306 | B1 | * | 3/2001 | Kurosawa | H01L 21/67144 228/102 |
| 6,283,693 | B1 | * | 9/2001 | Acello | H01L 21/67132 156/764 |
| 6,685,080 | B1 | * | 2/2004 | Kee | B23K 1/018 228/102 |
| 2002/0024883 | A1 | * | 2/2002 | Odashima | H01L 21/67144 365/52 |
| 2002/0030089 | A1 | * | 3/2002 | Leu | H01L 21/67144 228/248.1 |
| 2002/0088846 | A1 | * | 7/2002 | Bolde | B23K 1/018 228/264 |
| 2003/0060021 | A1 | * | 3/2003 | Kurosawa | H01L 21/67132 438/455 |
| 2003/0140486 | A1 | * | 7/2003 | Chen | G06K 19/077 29/825 |
| 2003/0141570 | A1 | * | 7/2003 | Chen | G01L 9/0054 257/618 |
| 2003/0218390 | A1 | * | 11/2003 | Huang | H01L 21/67132 310/12.16 |
| 2004/0093721 | A1 | * | 5/2004 | Watson | H01L 21/6835 29/729 |
| 2004/0118515 | A1 | * | 6/2004 | Huang | H01L 21/67132 156/707 |
| 2005/0036884 | A1 | * | 2/2005 | Takeuchi | H01L 21/67132 414/811 |
| 2005/0082352 | A1 | * | 4/2005 | Bolde | B23K 1/018 228/264 |
| 2006/0102285 | A1 | * | 5/2006 | Bluck | H01L 21/67161 156/345.32 |
| 2006/0137828 | A1 | * | 6/2006 | Fujisawa | H01L 21/67132 156/765 |
| 2007/0069340 | A1 | | 3/2007 | Yamada et al. | |
| 2007/0238264 | A1 | * | 10/2007 | Sekiya | H01L 21/67092 438/460 |
| 2007/0277929 | A1 | * | 12/2007 | Trinks | H01L 21/67132 156/707 |
| 2008/0227239 | A1 | * | 9/2008 | Shibata | H01L 21/67132 438/110 |
| 2008/0318346 | A1 | * | 12/2008 | Maki | H01L 21/67132 438/7 |
| 2009/0084499 | A1 | * | 4/2009 | Johnson | H01L 21/67092 156/765 |
| 2009/0109595 | A1 | * | 4/2009 | Herchen | H01L 21/6831 361/234 |
| 2009/0165292 | A1 | * | 7/2009 | Amurao | H05K 13/0486 29/764 |
| 2009/0202333 | A1 | * | 8/2009 | Ozono | H01L 21/67132 414/800 |
| 2010/0143088 | A1 | | 6/2010 | Stoppel | |
| 2010/0279491 | A1 | * | 11/2010 | Kiuchi | B32B 7/06 438/464 |
| 2013/0039733 | A1 | * | 2/2013 | Webb | H01L 21/67132 414/752.1 |
| 2013/0071220 | A1 | * | 3/2013 | Kuroda | H01L 21/67132 414/785 |
| 2014/0008017 | A1 | * | 1/2014 | Rie le | H01L 21/67011 156/293 |
| 2014/0186999 | A1 | * | 7/2014 | Schweikert | H01L 21/67109 438/106 |
| 2015/0104928 | A1 | * | 4/2015 | Kozai | H01L 21/67092 438/460 |
| 2015/0279716 | A1 | * | 10/2015 | Ko | H01L 21/6836 156/716 |
| 2015/0333221 | A1 | * | 11/2015 | Bibl | G09F 9/301 257/88 |
| 2016/0204017 | A1 | * | 7/2016 | Roesner | B25J 11/0095 156/272.2 |
| 2016/0268226 | A1 | * | 9/2016 | Lim | H01L 21/6835 |
| 2017/0358474 | A1 | * | 12/2017 | Hu | H01L 21/68742 |
| 2018/0019147 | A1 | * | 1/2018 | Boyea, Jr. | H01L 21/68 |
| 2018/0144959 | A1 | * | 5/2018 | Nemani | G01R 29/12 |
| 2018/0226281 | A1 | * | 8/2018 | Sogou | H01L 21/6838 |
| 2018/0366360 | A1 | * | 12/2018 | Hirai | H01L 21/6831 |
| 2019/0001433 | A1 | * | 1/2019 | Yamamoto | H01L 21/67092 |
| 2019/0080954 | A1 | * | 3/2019 | Kim | H01L 21/6838 |

FOREIGN PATENT DOCUMENTS

| | | | | | |
|---|---|---|---|---|---|
| JP | | 2000156594 A | * | 6/2000 | ....... H01L 21/67132 |
| JP | | 2004014956 A | * | 1/2004 | ....... H01L 21/67132 |
| JP | | 2005-322815 | | 11/2005 | |
| JP | | 2006108281 A | * | 4/2006 | ....... H01L 21/67132 |
| JP | | 2007109936 A | * | 4/2007 | ....... H01L 21/67092 |

* cited by examiner

METHOD AND DEVICE FOR SEVERING A MICROCHIP FROM A WAFER AND ARRANGING THE MICROCHIP ON A SUBSTRATE

RELATED APPLICATIONS

The present application is a U.S. National Stage application of International PCT Application No. PCT/DE2017/100035 filed on Jan. 23, 2017 which claims priority benefit of German Application No. DE 10 2016 001 322.2 filed on Jan. 29, 2016, the contents of each are incorporated by reference in their entirety.

BACKGROUND OF THE INVENTION

As more and more component assemblies and/or component parts become progressively more complex in increasingly smaller units, e.g., in semiconductor engineering, microsystems technology, telecommunications, security technology, energy production or measuring technology, the component assemblies and/or component parts are increasingly embodied by individual chips which are arranged adjacent to one another on a substrate.

Chips of this kind can have outer dimensions in the micrometer range.

Within the meaning of the present description, "substrate" designates a base material serving as a carrier for, e.g., printed circuit boards, circuits, conductor boards, lithography masks or photomasks, modules, e.g., for smartphones, for mobile communications or for chip-based security solutions, e.g., passports, for SIM cards, energy-efficient solutions, memory units, etc. However, it can also be a printed circuit board that is already pre-treated in a required shape or treated or outfitted on one side.

Conventional pick-and-place robots are typically used to populate a substrate with chips. These pick-and-place robots typically process components or chips having a thickness of several hundreds of micrometers and a surface area of several square millimeters to one square centimeter or more. They are not suitable for handling microchips, that is, within the meaning of the present application, chips with a surface area of at most a few square millimeters, particularly a surface area of less than 1 mm$^2$ and thicknesses of less than 200 µm to less than 50 µm, e.g., 5 µm. Microchips with a surface area of less than 1 mm$^2$ and a thickness of less than 5 µm are referred to hereinafter as membrane chips insofar as a microchip on this order of magnitude is specified. Aside from typical microchips with an electronic function, referred to hereinafter as electronic microchips, there are microchips with an optical function, referred to hereinafter as optical microchips. They can have even smaller dimensions than electronic microchips, particularly smaller thicknesses of only 1 to 2 µm. The surface area determined by the length and width of approximately 30 µm to 1 mm can be even smaller than in electronic microchips. Optical microchips are produced from optically transparent materials, e.g., SiO2 or Si3N4. Therefore, optical microchips in particular are constructed as membrane chips.

There are microchips and particularly membrane chips having dimensions of up to two orders of magnitude below those of conventional chips and, therefore, masses which are smaller by about six orders of magnitude. The small thickness and small surface area result in specific problems with regard to handling, precise positioning, planarity, stable connection and, as the case may be, conductive bonding of the microchip.

Microchips having such small geometric dimensions cannot be processed through conventional automatic populating devices, glue/solder connections, wire bonding or flip chip bonding. Common integrated circuit packaging methods such as sawing, pick-and-place, gluing, soldering, wire bonding or flip chip bonding can be resorted to only to a limited extent or not at all.

For example, while there are micro-manipulators for manipulating samples of focused ion beam (FIB) sections, they are very expensive to use and are not suitable for a fast and efficient component fabrication or microchip processing. There are also many micromechanical grippers documented in the literature, but they do not allow long movement paths and would have to be combined in a complicated manner with long manipulators having extensive reach.

EP 1 336 986 A1 discloses a method for producing a wafer with at least one thin electronic microchip which is held in a carrier body by a plurality of retaining tabs (referred to as fastening mechanisms) connecting the carrier body and microchip and a device and a method for separating an electronic microchip of this type from a wafer and for handling the removed microchip. By "microchip" is meant in this case chips having a thickness of less than 100 µm, especially a thickness of between 50 µm and 5 µm.

A prefabricated wafer with microchips which are held in each instance inside a cutout of a carrier body by a plurality of retaining tabs connecting the carrier body and microchip has the advantage that the microchips are ready to be transported after being severed and arranged on a substrate without having to undergo a further machining process.

To protect the wafer during transporting and handling and to remove the microchip, the wafer is placed on a base which has an arrangement of through-holes correlating with the cutouts of the carrier body so that the through-holes are arranged underneath the microchip to be separated. It is indicated as important that the base is rigid because the wafer is at risk of fracturing due to the plurality of microchips which are surrounded by a groove and connected to the wafer only via the retaining tabs. A free movement of one of the ejector pins in one of the cutouts of the carrier body and, therefore, positioning thereof beneath one of the microchips is made possible through the through-holes.

For separating a microchip, a handling device is advanced toward the microchip from the side of the wafer remote of the base. A downward pressure is applied to the microchip opposed to the ejector pin with this handling device. In so doing, the retaining tabs are flexed and broken. The microchip is preferably held on by suction during this so that it cannot slip when the retaining tabs break and is held horizontally.

After the microchip has been severed, the ejector pin and the handling device are moved upward together to ensure that remnants of retaining tabs do not strip off the microchip from the handling device. Subsequently, the ejector pin is lowered again and the microchip is held and transported such that it is sucked against the handling device by a vacuum.

In order to place the microchip on a substrate, a membrane in this instance, the handling device is positioned over the membrane and lowered. The suction tip provided at the handling device is spring-mounted so that it can be fitted softly and the membrane is not damaged. The vacuum source is switched off and the handling device is lowered and is ready to remove a subsequent microchip.

It is not shown how the microchip is fastened to the membrane.

It can be deduced that the circumferential shape of the microchip according to the above-cited EP 1 336 986 B1 is rectangular, i.e., the circumferential edge of the microchip is described by straight lines forming a rectangle.

In contrast to the above-cited EP 1 336 986 B1 in which the circumferential edge is defined by a slit which completely surrounds the electronic microchip and which is partially overlapped by retaining tabs which are arranged subsequently, it is also known to produce microchips which are held in a carrier body by retaining tabs which are monolithically connected with the microchip at this carrier body and which are formed by webs which interrupt the surrounding slit. A method suitable for this purpose for producing microchips with optical function is, e.g., anisotropic Si-etching in which $SiO^2$ layers are processed to form membranes. The microchip is then severed from the wafer from the membrane by a cutting process along its circumferential edge up to the remaining retaining tabs in the form of webs. In other words, the portion of the membrane that forms the microchip remains monolithically connected to a portion of the membrane at the wafer. Up until the present time, however, microchips could only be produced in this way to a limited extent to thicknesses of greater than 5 μm because the methods for severing them were not suitable for smaller thickness.

SUMMARY OF THE INVENTION

It is the object of the invention to provide a device which can be produced more economically and which is suitable particularly for handling membrane chips having a thickness of less than 5 μm.

It is likewise an object of the invention to find a method which requires a comparatively lower expenditure for its implementation and which is suitable particularly for handling a membrane chip having a thickness of less than 5 μm.

This object is met for a method according to claim 1 and for a device according to claim 5. Advantageous configurations are disclosed in the dependent subclaims.

BRIEF DESCRIPTIONS OF THE DRAWINGS

The invention is described more fully in the following description with reference to an embodiment example illustrated in the annexed drawings, in which.

FIGS. 3*a*-3*g* are diagrams for explaining the progression of the method.

DESCRIPTION OF THE EMBODIMENTS

Figure 1:
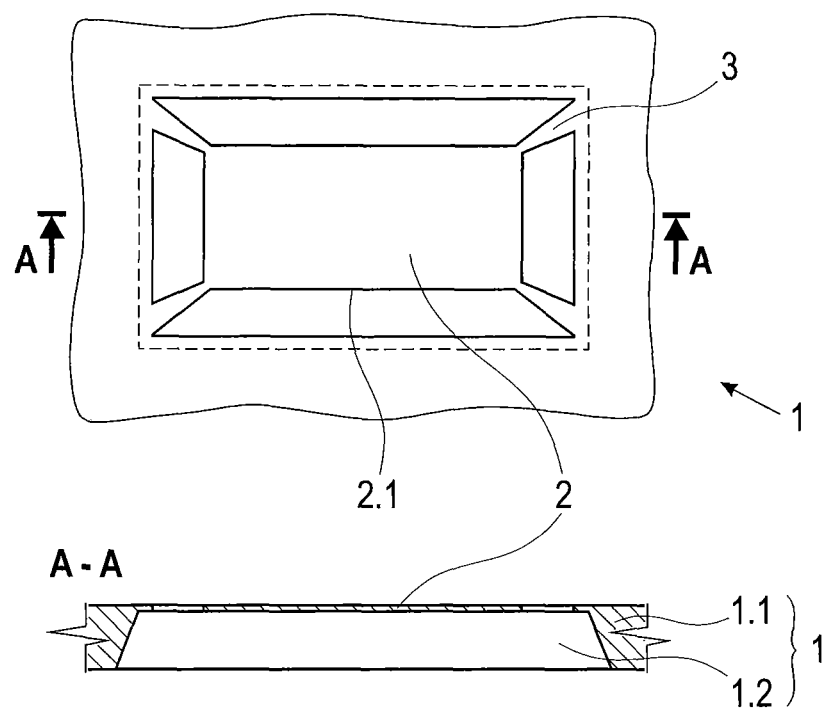
FIG. 1 is a schematic view of a wafer with a microchip.

The device serves for separating microchips 2 from a wafer 1, particularly microchips 2 with the dimensions of a membrane chip. The wafer 1 is formed by a carrier body 1.1 with cutouts 1.2 in which one of the microchips 2 is held in each instance via retaining tabs 3. A wafer 1 of this type is shown schematically in FIG. 1. The microchips 2 have very small dimensions, e.g., 3 μm×100 μm×250 μm, and therefore have a very small thickness. Usually, the most common shape of the circumferential edge 2.1 of the microchip 2 is a rectangle. Other circumferential shapes such as circles or triangles are conceivable. In this regard, it is advantageous for a method according to the invention when the retaining tabs 3 engage at the microchip 2 so as to be equidistant from the center point of the microchip 2 and are preferably arranged at corners possibly formed by the circumferential edge 2.1 so as to be uniformly distributed around the circumferential edge 2.1. The retaining tabs 3 can be connecting webs which are monolithically connected to the carrier body 1.1 and the microchip 2. They can also be discrete elements which are connected to the carrier body 1.1 on the one hand and to the microchip 2 on the other hand preferably by bonding. The retaining tabs 3 preferably have predetermined breaking points.

Figure 2:
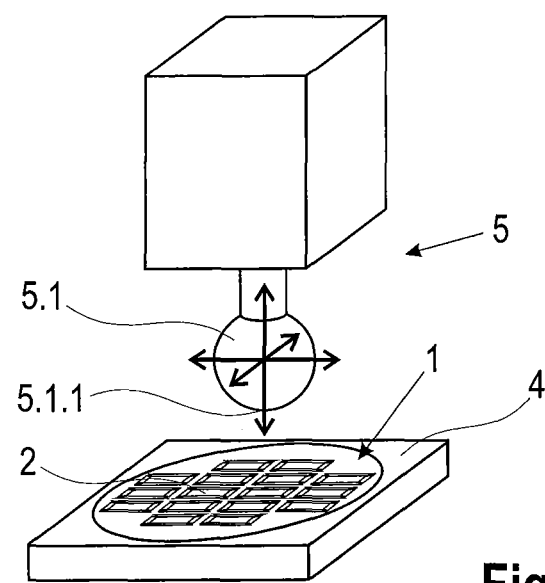
FIG. 2 shows a wafer positioned with respect to the device.

As is shown in FIG. 2, the device basically comprises a base 4 for depositing the wafer 1 and a handling device 5 with a tip 5.1 which can be positioned horizontally with respect to the microchip 2 and can be raised and lowered vertically.

At one free end 5.1.1, at least over a contact surface via which the surface of the tip 5.1 comes in contact with the microchip 2, the tip 5.1 has a surface quality which is configured to bring about an adhesive force between the microchip 2 and the tip 5.1 that is only negligibly greater than the weight force of the microchip 2.

Since the adhesive force between the contact surface at tip 5.1 and the microchip 2 is determined by the surface quality of the contact surface and the surface quality of the microchip 2, the two of them can be manufactured so as to conform to one another in order to generate a corresponding adhesive force between the two interfaces. This means that the surface quality of the microchip 2 can also be adapted by means of its surface roughness or surface texture insofar as its function is not impaired.

The free end 5.1.1 of the tip 5.1 is advantageously spherically formed at least in the region of the contact surface so that the microchip 2 contacts the tip 5.1 uniformly starting with its center point MP, while this tip 5.1 is lowered onto the microchip 2.

The free end 5.1.1 of the tip 5.1 is preferably formed as a ball, e.g., of ruby, sapphire or the like material for which a very high surface quality can be achieved.

Separating a microchip 2 from a wafer 1 (see FIG. 3*a*) requires a highly precise positioning of the tip 5.1 above the microchip 2 so that, on the one hand, the microchip 2 is associated with the tip 5.1 in a defined manner and so that the microchip 2 can be lowered onto a substrate 6 again also in a defined manner and, on the other hand, in order to introduce shear forces and bending forces into the retaining tabs 3 in a defined manner. Required positioning accuracies of this kind may be achieved with coordinate measuring machines. They are basically used to measure geometric quantities of objects, for which contacting (tactile) sensors and non-contacting sensors can be used.

In order to position the microchip 2 on the substrate 6 in a highly precise manner, it is important that the microchip 2 always has a defined relative position with respect to the tip 5.1 during handling, i.e., starting from the first contact with the tip 5.1 until disengagement from the tip 5.1. This means that the relative position of the center point MP of the microchip 2 with respect to the center axis A of the tip 5.1 and the rotational position of the microchip 2 at the tip 5.1 must remain unchanged. The critical moment occurs when the microchip 2 is separated from the carrier body 1.1. The arrangement of the retaining tabs 3 and the defined placement of the tip 5.1 on the microchip 2 cause identical shear forces and bending forces to act on the retaining tabs 3 so that the retaining tabs 3 break at the same time. If the retaining tabs 3 do not break at exactly the same time, it can result that the microchip 2 that is ultimately separated adheres to the tip 5.1 so as to be shifted and rotated with respect to its original position relative to the tip 5.1.

To remedy this, it is advantageous when producing a microchip 2 which is connected to the carrier body 1.1 of the wafer 1 via monolithic retaining tabs 3 before being cut out of the wafer 1 to at least partially configure the circumferential edge 2.1 of the microchip 2 such that the microchip 2 and the carrier body 1.1 are arranged so as to mesh with one another. Assuming that the circumferential edge 2.1 is divided into a plurality of circumferential edge portions by the retaining tabs 3, it is advantageous to provide at each of the circumferential edge portions at least one bulge which engages in the wafer 1 or carrier body 1.1 or an indentation in which the wafer 1 or carrier body 1.1 engages. A displacement of the microchip within a plane defined by the wafer is then limited to the spacing of the bulge or indentation. A rotation is limited to a rotational angle determined by a radian measurement which corresponds approximately to this spacing.

In addition to the use of a tip 5.1 at which the microchip 2 is held by adhesive force, a key idea of the invention consists in using a coordinate measuring machine as device. In this case, the positioning arrangement of the coordinate measuring machine constitutes the handling device 5 and the measuring table constitutes the base 4, and a tactile measuring head containing the tip 5.1 is provided at the positioning arrangement.

Coordinate measuring machines have in common that the measuring head is movable in Y-X direction of a Cartesian coordinate system relative to the measuring table. At least in coordinate measuring machines having a tactile measuring head, the latter is also movable vertically relative to the measuring table. It is suggested to use a coordinate measuring machine of this type in an uncharacteristic way in order to separate the microchip 2 from the wafer 1, to transport it to the substrate 6 which is placed on the measuring table at the same time as the wafer 1 and to deposit it on the measuring table.

The course of the method according to the invention will be described in the following referring to FIGS. 3a-3g. In order to implement the method, a wafer 1 which is connected to a carrier body 1.1 inside a cutout 1.2 of a carrier body 1.1 by a plurality of retaining tabs 3 is arranged on a horizontally oriented, rigid base 4.

Figure 3A:
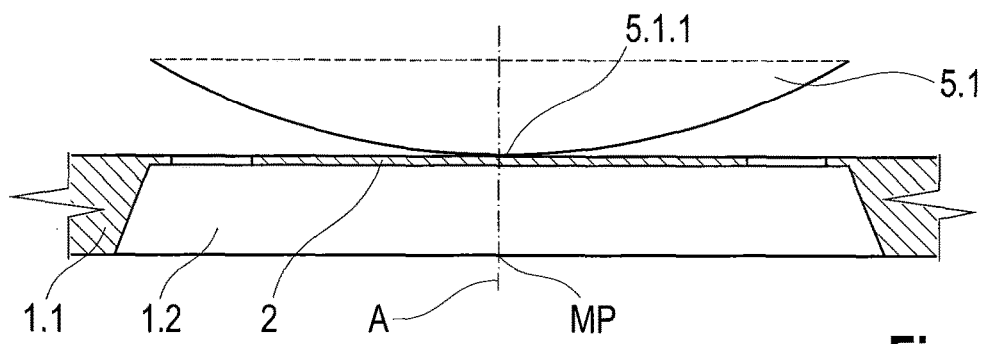

Subsequently, a tip 5.1 of a handling device 5 which advantageously has a spherical surface is positioned horizontally in a highly precise manner above the microchip 2 such that the center axis A of the tip 5.1 through which the position of the tip 5.1 is defined impinges on the geometric center point MP of the microchip 2 when the tip 5.1 is vertically lowered (FIG. 3a).

Figure 3B:
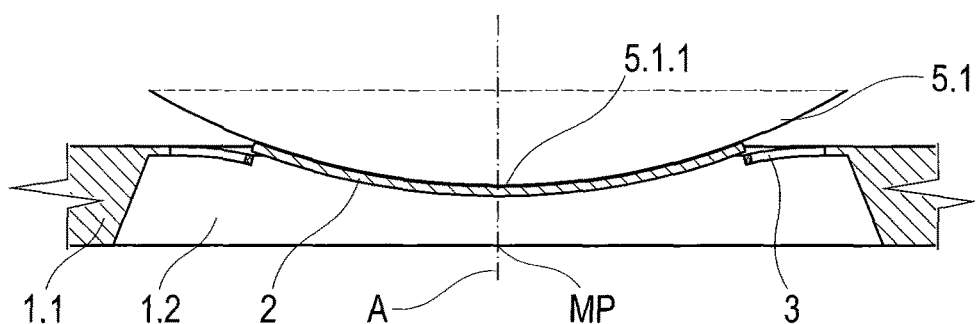

When the tip 5.1 is lowered farther it dips into the cutout 1.2, while the tip 5.1 contacts the microchip 2 and the retaining tabs 3 are acted upon by shear forces and/or bending forces until they break so that the microchip 2 is severed from the carrier body 1.1 (FIG. 3b).

While the tip 5.1 contacts the microchip 2, a contact bonding process is initiated so that the microchip 2 which is severed from the carrier body 1.1 is held at the tip 5.1 by adhesive force.

Figure 3C:
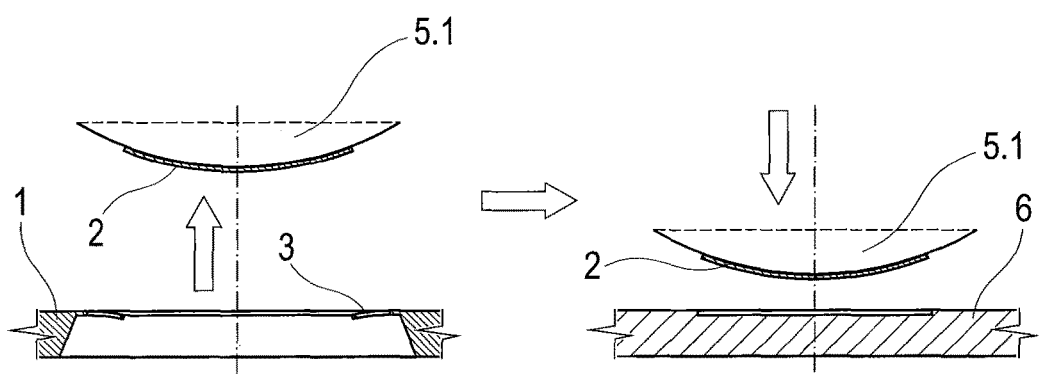
Figure 3D:
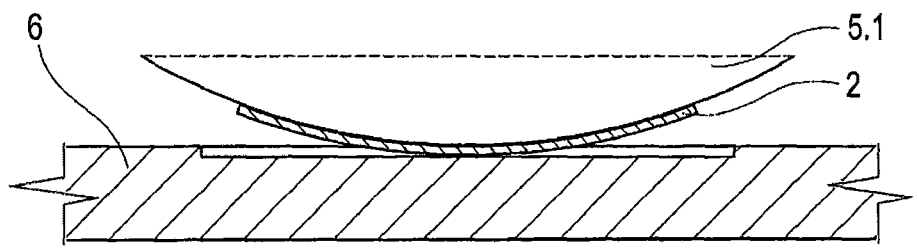
Figure 3E:
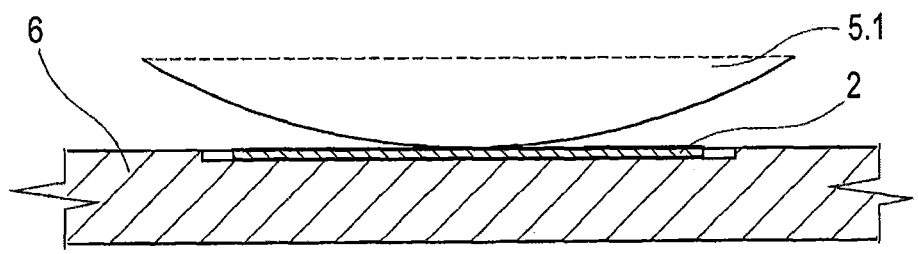
Figure 3F:
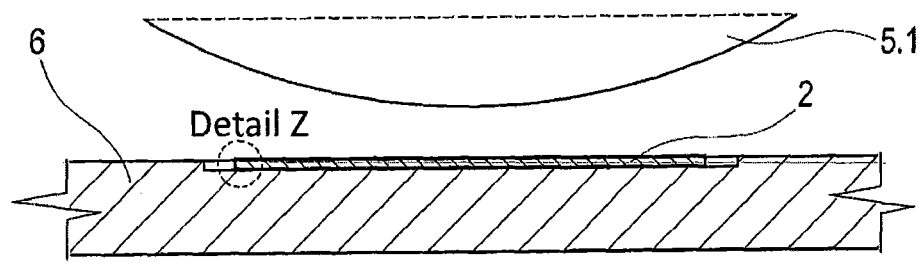
Figure 3G:
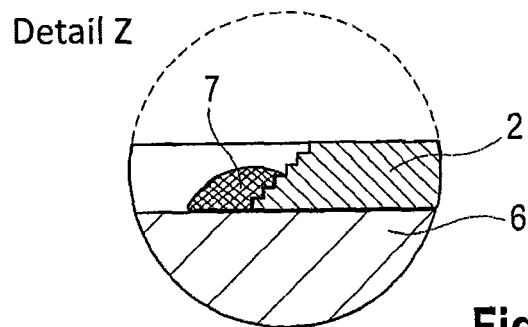

The microchip 2 is subsequently held at the tip 5.1 by means of the handling device 5, transported to the substrate 6 and deposited on the latter. In so doing, the tip 5.1 is lifted vertically, moved horizontally and positioned in an offset manner at a location above the substrate 6, where the microchip 2 is vertically lowered and deposited on the substrate 6 (FIGS. 3c and 3d). When deposited, the microchip 2 contacts the substrate 6 and a further contact bonding process is advantageously initiated. The adhesive force which is brought about in this way between the substrate 6 and the microchip 2 is greater than the adhesive force between the tip 5.1 and the microchip 2 so that the microchip 2 adheres to the substrate 6 by adhesive force after the tip 5.1 is lifted from the substrate 6 (FIGS. 3e and 3f).

The temporary contact bonding at the tip 5.1 and the permanent contact bonding at the substrate 6 can be reinforced through electrostatic forces by applying voltage.

The tip 5.1 can advantageously be positioned above a microscope on the way to the substrate 6, e.g., in order to inspect the microchip 2 for contamination or to verify the exact position on the tip 5.1.

Particularly when the microchips are membrane chips, glue can be dispensed with in part or completely as connecting means when the surface of the substrate 6 is sufficiently smooth.

Fixing the microchip 2 directly to the substrate 6 without a glue renders the resulting connection especially suitable for applications in the UV range. To provide a secure, long-lasting connection, a laser-induced metal deposition, e.g., Cr Mo, can advantageously be generated, which forms a metal bead 7 at an edge of the microchip 2 adhering to the substrate 6 so that the microchip 2 is permanently connected to the substrate 6. Electrical contacts can also be produced if needed between the microchip and the substrate with this laser-induced metal deposition.

The method according to the invention is suitable particularly for severing membrane chips from a wafer which could not be produced heretofore in these extremely small dimensions because there was no suitable method for separating and handling microchips of this size.

While the invention has been illustrated and described in connection with currently preferred embodiments shown and described in detail, it is not intended to be limited to the details shown since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as are suited to the particular use contemplated.

REFERENCE CHARACTERS 1 wafer
1.1 carrier body
1.2 cutout
2 microchip
2.1 circumferential edge
3 retaining tab
4 base
5 handling device
5.1 tip
5.1.1 free end
6 substrate
7 metal bead
A center axis
MP center point

What is claimed is:

1. Method for severing a microchip from a carrier body of a wafer and arranging the microchip on a substrate, wherein the microchip is connected to the carrier body inside a cutout of the carrier body by a plurality of retaining tabs, comprising the following method steps: arranging the wafer on a rigid base; arranging a tip of a handling device above the microchip; moving the tip downward towards the microchip, wherein shear forces and/or bending forces act on the retaining tabs while the tip contacts the microchip and these retaining tabs are broken so that the microchip is severed from the carrier body, wherein a contact bonding process is initiated when the tip contacts the microchip so that the microchip which is severed from the carrier body is held at the tip by an adhesive force, and is transported to the substrate and deposited thereon.

2. Method for severing a microchip from a carrier body of a wafer and arranging the microchip on a substrate according to claim 1, further comprising applying voltage to the tip so that electrostatic forces reinforcing the contact bonding process are generated.

3. Method for severing a microchip from a carrier body of a wafer and arranging the microchip on a substrate according to claim 1, further comprising initiating an additional contact bonding process when the microchip contacts the substrate, wherein the adhesive force which is brought about between the substrate and the microchip is greater than the adhesive force between the tip and the microchip so that the microchip adheres to the substrate by adhesive force after the tip is lifted from the substrate.

4. Method for severing a microchip from a carrier body of a wafer and arranging the microchip on a substrate according to claim 3, wherein said voltage is applied to the substrate so that electrostatic forces reinforcing the contact bonding process are generated.

5. Method for severing a microchip from a carrier body of a wafer and arranging the microchip on a substrate according to claim 1, wherein the microchip contacts the tip starting from its center point as the tip moves into full contact with the microchip.

6. Method for severing a microchip from a carrier body of a wafer and arranging the microchip on a substrate according to claim 3, further comprising generating laser-induced metal deposition, which forms a metal bead at an edge of the microchip adhering to the substrate so that the microchip is permanently connected to the substrate.

\* \* \* \* \*